United States Patent [19]

Luce

[11] 4,334,195
[45] Jun. 8, 1982

[54] VOLTAGE CONTROLLED ATTENUATOR

[75] Inventor: David A. Luce, Clarence Center, N.Y.

[73] Assignee: Norlin Industries, Inc., White Plains, N.Y.

[21] Appl. No.: 153,832

[22] Filed: May 27, 1980

[51] Int. Cl.³ .......................... H03K 5/08; H03L 5/00
[52] U.S. Cl. ..................................... 328/168; 307/264; 307/353; 307/556; 328/151; 328/172
[58] Field of Search ............... 307/264, 353, 540, 552, 307/555, 556, 557; 328/168, 169, 172, 151; 333/14, 176, 20, 81 R, 173

[56] References Cited

U.S. PATENT DOCUMENTS 3,836,856  9/1974  Lovadina et al. ................... 328/168

*Primary Examiner*—John Zazworsky
*Attorney, Agent, or Firm*—Ronald J. Kransdorf; Jack Kail

[57] ABSTRACT

A voltage controlled attenuator comprises a switching circuit operable for alternately coupling a capacitor to a source of input signal voltage and to a discharge circuit for first and second time intervals respectively, the duration of the second time interval being set in accordance with an applied control voltage. An output circuit includes apparatus for sampling the decayed input signal voltage developed by the capacitor following each of the second time intervals for developing an output signal comprising an attenuated representation of the input signal.

15 Claims, 4 Drawing Figures

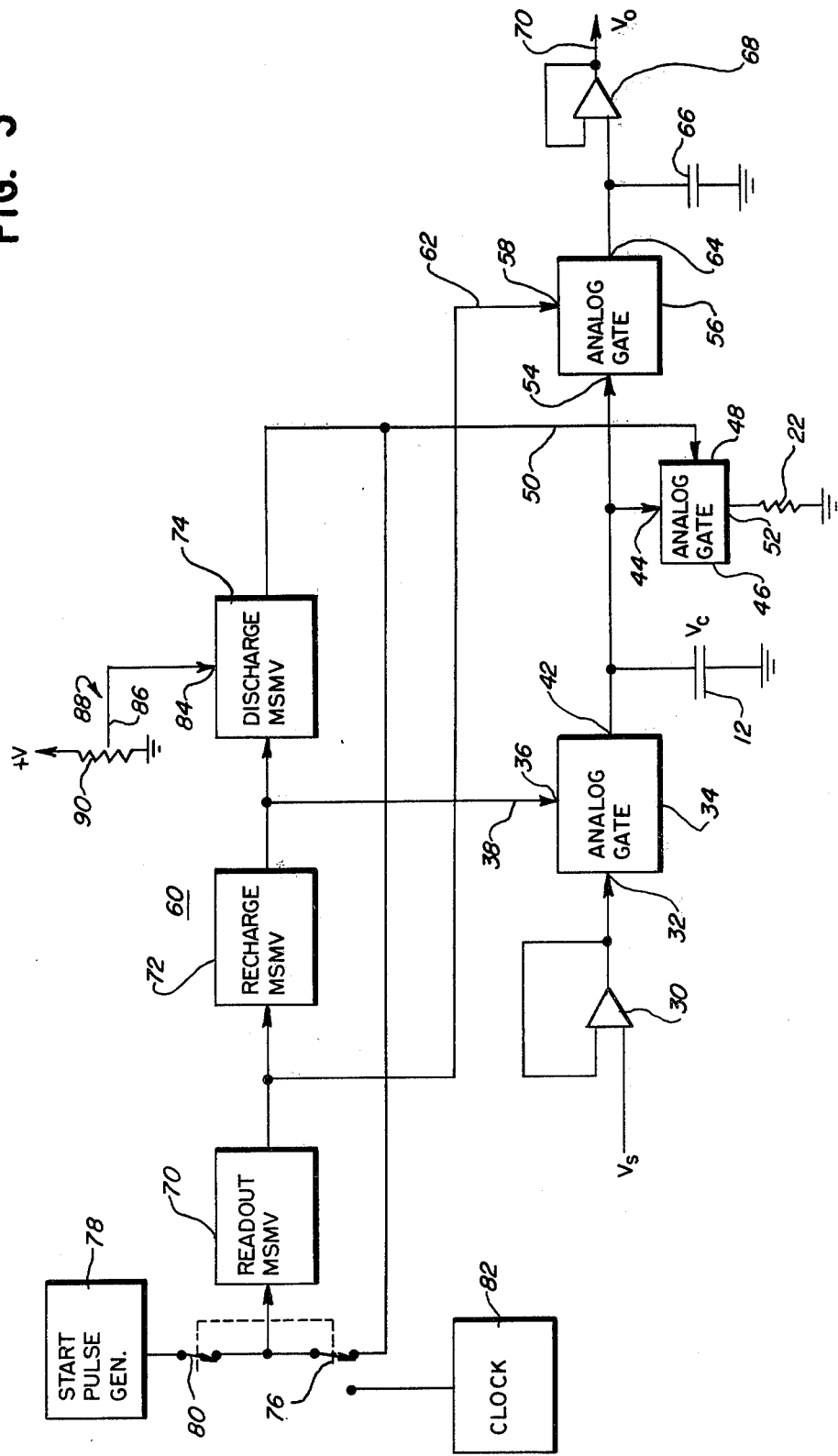

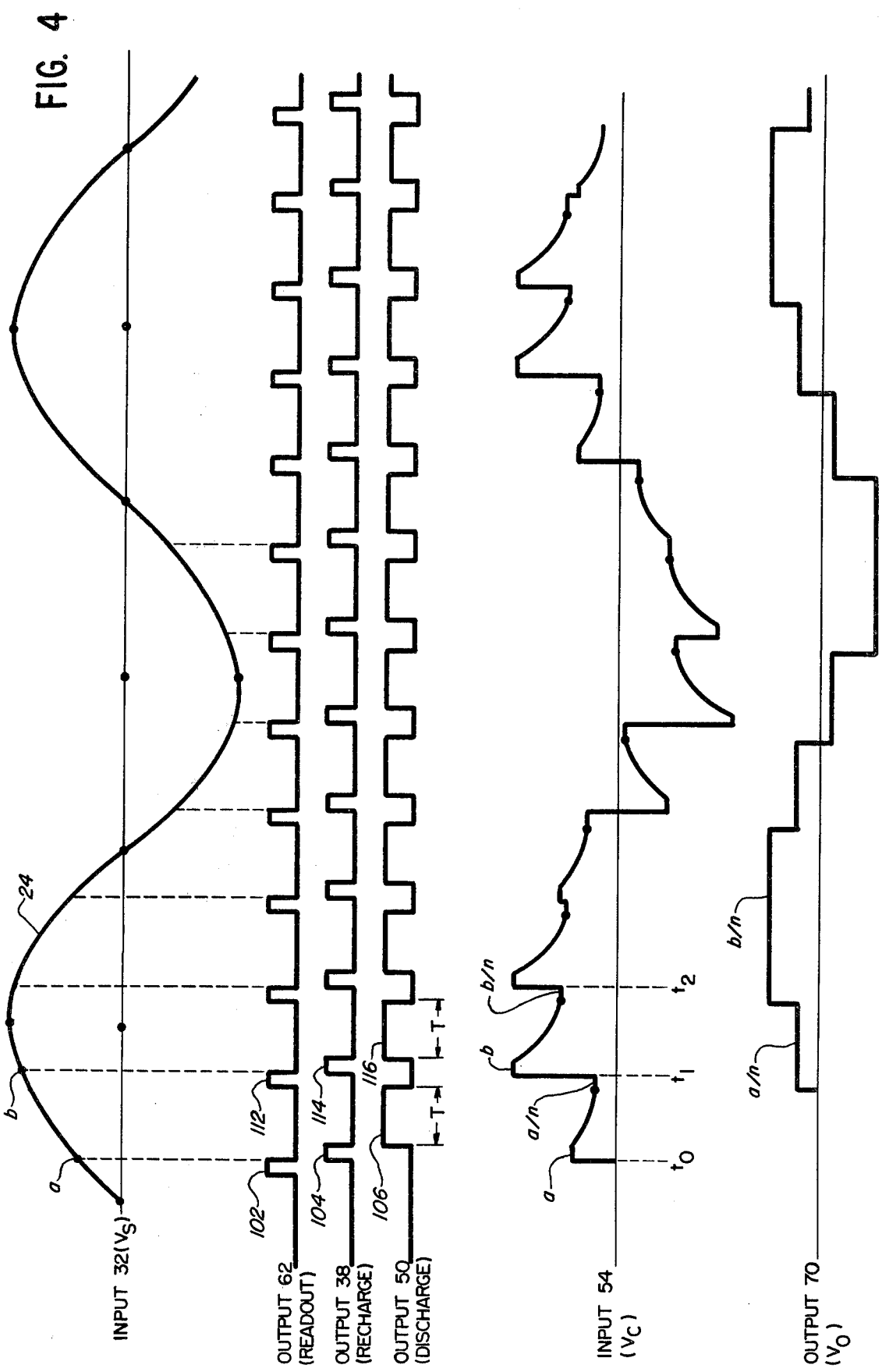

VOLTAGE CONTROLLED ATTENUATOR

BACKGROUND OF THE INVENTION

The present invention relates generally to voltage controlled attenuators and, more paticularly, to a voltage controlled attenuator which is especially useful in association with an electronic musical instrument.

Voltage controlled attenuators, frequently referred to in the art as voltage controlled amplifiers, are typically employed in electronic musical instruments as keying circuits wherein an audio signal is selectively attenuated in accordance with an input control voltage. The audio signal, a sine wave for example, is applied to the data input of the attenuator while the control voltage, usually in the form of a desired envelope signal, is coupled to the control input of the attenuator. An output signal is thereby produced consisting of the input audio signal amplitude modulated in accordance with the control voltage envelope. Voltage controlled attenuators are also sometimes used in electronic musical instruments to control the operation of a voltage controlled oscillator. For example, a "trill" sound is typically produced by suitably controlling the level of a square wave signal coupled to the control input of a voltage controlled oscillator.

Various techniques have been used in the past to implement voltage controlled attenuator designs. Such prior art techniques include the use of photocells, operational transconductance amplifiers and various forms of multiplying circuits, both digital and analog. The performance of these prior art circuits, while satisfactory in certain respects, is somewhat deficient in others. In this regard, a voltage controlled attenuator, especially one having application in an electronic musical instrument, is preferably characterized by a number of important qualities. Initially, the attenuator should have a high degree of environmental stability. Devices incorporating photocells and operational transconductance amplifiers are quite temperature sensitive and therefore have difficulty in providing the required degree of environmental stability. The attenuator should also provide extremely accurate levels of attenuation and have a strictly linear response over a relatively wide dynamic range of attenuation settings and input frequencies. Another highly desirable attribute of a voltage controlled attenuator resides in the provision of an exponential or logarithmic transfer function allowing for a relatively wide control capability using only a small differential control voltage. Such an exponential control transfer function also results in a constant percentage accuracy wherein higher resolution attenuation is achieved at low voltage control signal levels and somewhat lower resolution is achieved for higher control voltage signal levels. Yet another desirable characteristic of voltage controlled attenuator design is the provision of a relatively flat bandwidth from DC to some desired frequency.

One aspect of prior art voltage controlled attenuators which contributes to the inability of such devices to meet or satisfy the above criteria involves the rather extensive use of active electronic components. The voltage controlled attenuator of the present invention, on the other hand, employs techniques which may be implemented using only passive components and switching circuits, thereby enabling the aforementioned design criteria to be largely satisfied by a relatively simple and inexpensive circuit which is easily implemented in in integrated circuit form.

SUMMARY OF THE INVENTION

In accordance with the foregoing, it is a basic object of the present invention to provide a novel voltage controlled attenuator having particular utility in association with an electronic musical instrument, although not limited thereto.

It is a more specific object of the invention to provide an improved voltage controlled attenuator employing operational techniques which may be realized in a circuit incorporating only passive components and switching devices thereby enabling a variety of design criteria to be conveniently and inexpensively satisfied.

These and other objects are achieved by the voltage controlled attenuator of the present invention through the agency of a sampling device operated for sampling an input signal voltage at a rate equal to at least twice the frequency of the input signal. A discharging circuit allows each of the voltage samples to exponentially decay towards a reference level at a predetermined rate and for a time interval established in accordance with an applied control voltage. An output signal, comprising an attenuated representation of the input signal, is formed by sampling the decayed voltage samples following each decay time interval.

BRIEF DESCRIPTION OF THE DRAWINGS

FIG. 3 is an electrical block diagram illustrating a preferred embodiment of the voltage controlled attenuator of the present invention.

FIG. 4 graphically depicts a series of exemplary waveforms developed at various points in the circuit of FIG. 3.

DESCRIPTION OF THE PREFERRED EMBODIMENT

Figure 1:
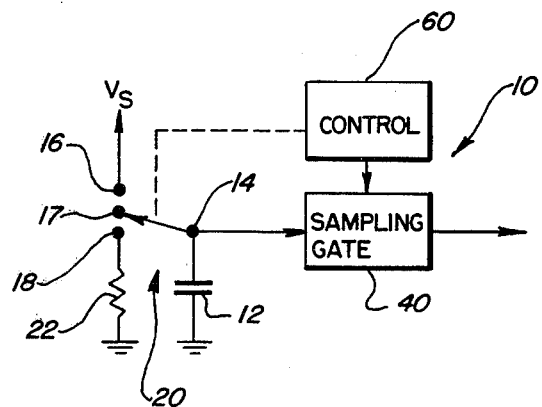
FIG. 1 is an electrical diagram, partly in schematic form and partly in block form, conceptually illustrating the voltage controlled attenuator of the present invention.

While the voltage controlled attenuator of the invention, represented generally in FIG. 1 by reference numeral 10, will be described herein in terms of its utility in relation to an electronic musical instrument, it will be understood that such constitutes only an exemplary application of the attenuator and is not intended to be of a limiting nature in respect of the scope of the invention. Thus, in general, the voltage controlled attenuator 10 may be used in any situation where it is desired to attenuate an input signal in accordance with a control function.

Referring now to FIG. 1, the voltage controlled attenuator 10 basically comprises a voltage sampling capacitor 12 having one of its plates connected to a node 14 and the other plate to a source of ground potential. Preferably, the capacitor 12 uses a dielectric having a low absorption characteristic, e.g. polystyrene, in order to achieve accurate exponential decays. The node 14 is connected to a switch assembly 20 and to the input of a sampling gate 40. A control circuit 60 is provided for controlling the operation of the switch assembly 20 and the sampling gate 40. The switch assembly 20, under the control of the control circuit 60, is operable for selectively coupling the capacitor 12 to a terminal 16 connected to a source of input signal voltage $V_s$, to a terminal 18 connected to a resistor 22 whose opposite end is connected to ground potential and to an intermediate terminal 17.

Figure 2:
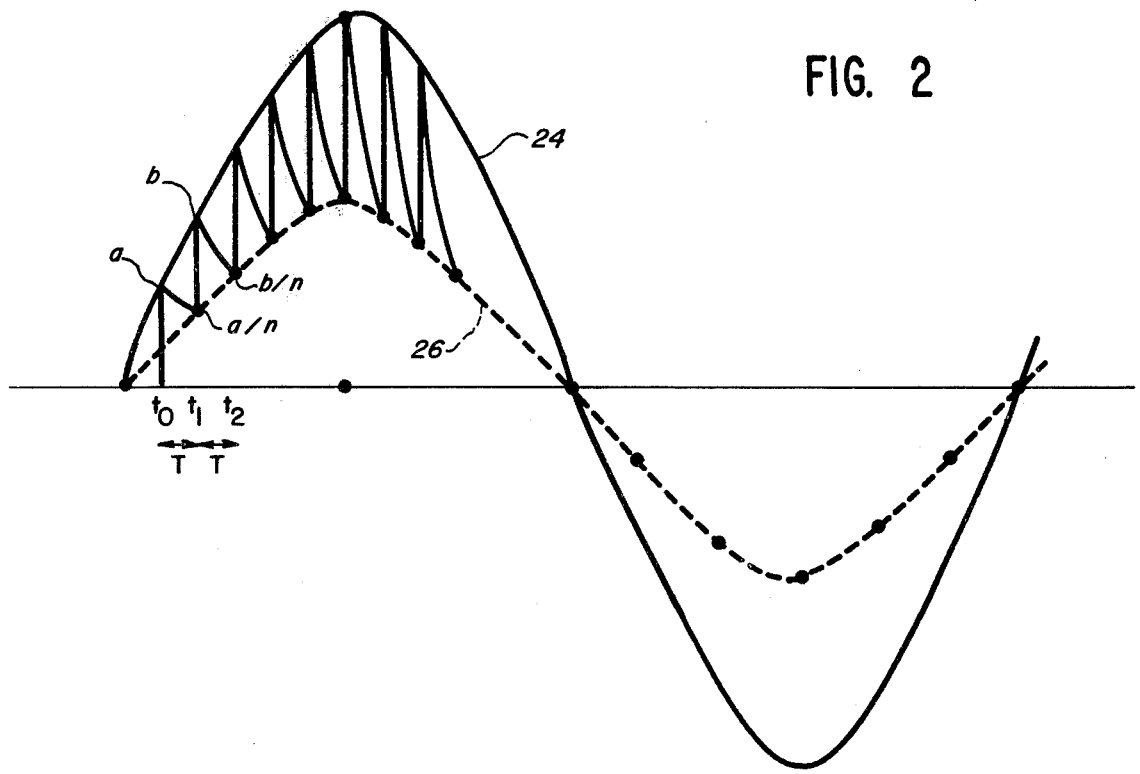
FIG. 2 illustrates, in a superimposed manner, input and output signal waveforms useful in explaining the operation of the circuit of FIG. 1.

The operation of the circuit shown in FIG. 1 will be most readily understood with reference to the waveform of FIG. 2. In FIG. 2, the solid line waveform 24 represents the input signal voltage $V_s$ while the dashed line waveform 26 represents an attenuated version thereof as would be produced at the output of the sampling gate 40 of the attenuator 10. The attenuated waveform 26 is derived from the input waveform 24 essentially in the following manner. Initially, at a time $t_o$ the control circuit 60 operates the switch assembly 20 for coupling the capacitor 12 to the terminal 16, and thereby to the source of input signal voltage $V_s$, causing the capacitor to charge to a voltage level a corresponding to the instantaneous amplitude of the waveform 24 at time $t_o$. Thereafter, the control circuit 60 operates the switch assembly 20 for coupling the capacitor 12 to the terminal 18 allowing the capacitor to discharge through the resistor 22. The switch assembly 20 is maintained in the discharge position by the control circuit 60 for a selected time interval T during which the voltage across the capacitor 12 will have exponentially decayed from the level a by a corresponding percentage to a level a/n. At time $t_1$, occurring at the end of the discharge interval T, the control circuit 60 enables the sampling gate 40 for sampling and holding the voltage a/n then developed across the capacitor 12.

The foregoing procedure is repeated at time $t_1$. More specifically, slightly after time $t_1$ the control circuit 60 again operates the switch assembly 20 for coupling the capacitor 12 to the source of input signal voltage $V_s$. As a result, the capacitor 12 is charged from the voltage level a/n to a level b corresponding to the instantaneous amplitude of the waveform 24 at time $t_1$. Thereafter, the control circuit 60 operates the switch assembly 20 for reconnecting the capacitor 12 to the discharge resistor 22 for the discharge interval T. The capacitor 12 will therefore discharge from voltage level b to voltage level b/n at time $t_2$ occurring at the end of the discharge interval T.

Quite significantly, it will be noted that due to the proportional nature of the discharge cycles achieved by maintaining the discharge time interval T constant, the percentage of decay 1/n is the same for both cycles. Thus, by continuously repeating the foregoing charge-discharge-sample process, a plurality of voltage samples representing the input signal voltage attenuated by a factor of n is coupled to the output of the sampling gate 40. The attenuation factor n is conveniently controlled by varying the discharge time interval T. Increasing the discharge time interval T will correspondingly increase the attenuation factor n while decreasing the discharge time interval T will correspondingly decrease the attenuation factor n. In this manner, an attenuated voltage signal as represented by waveform 26 may be conveniently derived from an input signal voltage as represented by waveform 24 with the attenuation relationship therebetween being precisely controllable by varying the discharge time interval T.

FIG. 3 illustrates a preferred embodiment of the circuit shown generally in FIG. 1. The input signal voltage $V_s$ is coupled through a buffering operational amplifier 30 to the data input 32 of a first analog gate 34. The analog gate 34 includes a control input 36 supplied from an output line 38 of the control circuit 60 and an output terminal 42 connected in common to the ungrounded plate of the capacitor 12 and the data input 44 of a second analog gate 46. The analog gate 46 includes a control input 48 supplied from an output line 50 of the control circuit 60 and an output terminal 52 connected to the ungrounded end of the resistor 22. The output terminal 42 of the analog gate 34 is also connected to the data input 54 of yet a third analog gate 56. The analog gate 56 includes a control input 58 supplied from an output line 62 of the control circuit 60 and an output terminal 64 connected to the ungrounded plate of a sample and hold capacitor 66. The voltage developed across the capacitor 66 is coupled through a buffering operational amplifier 68 on whose output 70 is developed an output voltage signal $V_o$ which comprises an attenuated representation of the input voltage signal $V_s$.

The control circuit 60 comprises three negative edge triggered monostable flip-flops 70, 72 and 74 connected in a recirculating configuration. That is, the output 62 of the flip-flop 70 is connected to the input of the flip-flop 72 while the output 38 of the flip-flop 72 is connected to the input of the flip-flop 74. Finally, the output 50 of the flip-flop 74 is connected back to the input of the flip-flop 70 through a switch 76. A start pulse generator 78, which is operable for generating a single start pulse in response to initiating the operation of the attenuator 10, is coupled through a switch 80 to the input of the multivibrator 70, the switch 80 being ganged for operation together with the switch 76. As will be described in more detail hereinafter, with the switches 76 and 80 in the positions shown in FIG. 3, the attenuator 10 assumes an asynchronous mode of operation. However, with the switch 76 operated to connect the output of a clock 82 to the input of the multivibrator 70, the attenuator 10 assumes a synchronous mode of operation.

The multivibrator 74 is characterized by an unstable state whose duration is determined in accordance with the level of a control voltage applied to its control input 84. The control voltage supplied to the input terminal 84 of the multivibrator 74 may be derived from any of a number of different sources including, for example, the output of an envelope generator of an electronic musical instrument. For purposes of simplicity and clarity, FIG. 3 shows the control voltage supplied to input 84 as being derived from the slider 86 of an adjustable potentiometer 88 which includes a resistive element 90 connected between a source of positive potential and ground potential.

The waveforms of FIG. 4 are illustrative of the operation of the voltage controlled attenuator shown in FIG. 3 with the switches 76 and 80 operated to provide asynchronous operation of the timing circuit 60. The initial waveform represents an input audio signal voltage $V_s$ corresponding to the input signal voltage waveform 24 of FIG. 2. The next three waveforms represent the outputs 62, 38 and 50 of the timing circuit 60. With further reference to the timing circuit output waveforms, the single start pulse generated by the start pulse generator 78 upon initiating operation of the voltage controlled attenuator 10 triggers the development of a first pulse 102 at the output 62 of the monostable multivibrator 70. The monostable multivibrator 70 is characterized by an unstable state of predetermined duration, preferably about 5 microseconds, so that the width of pulse 102 is of corresponding duration. The negative edge of pulse 102 triggers the next monostable multivibrator 72 which, in response thereto, produces a pulse 104 at its output 38. The monostable multivibrator 72 is also characterized by an unstable state of fixed duration, again preferably 5 microseconds, so that the pulse 104 has a corresponding width. The negative edge of the pulse 104 in turn triggers the voltage controlled monostable multivibrator 74. As a result, a pulse 106 is developed at the output 50 of the voltage controlled multivibrator 74 having a duration or pulse width T determined by the control voltage coupled to the input 84 of the multivibrator 74.

Since the output 50 of the voltage controlled multivibrator 74 is fed back to the input of multivibrator 70 through switch 76, the negative edge of the pulse 106 retriggers the multivibrator 70 which produces another 5 microsecond pulse 112 at its output 62. The negative edge of pulse 112, in turn, retriggers multivibrator 72 which produces another 5 microsecond pulse 114 at its output 38. Finally, the negative edge of pulse 114 retriggers the voltage control multivibrator 74 for producing a second pulse 116 of duration T at its output 50. The foregoing operation is continuously repeated whereby an asynchronous series of timing signals are developed at the outputs 62, 38 and 50 of the timing circuit 60 as illustrated in FIG. 4.

Referring back to FIG. 3, it will be recalled that the output 38 of the multivibrator 72 is coupled to the control input of the analog gate 34. As a consequence, the analog gate 34 is operated for coupling the input signal voltage $V_s$, represented by waveform 24, to the ungrounded plate of the capacitor 12 in time coincidence with each of the pulses developed at the output 38 of the multivibrator 72. Therefore, during the time intervals defined by the pulses developed at the output 38 the capacitor 12 rapidly charges to a voltage $V_c$ equal to the corresponding amplitude of the input signal voltage $V_s$. For example, referring to the next to the last waveform of FIG. 4, at time $t_0$, coinciding with the positive edge of pulse 104, the capacitor 12 rapidly charges to a voltage equal to the corresponding amplitude of the input signal voltage $V_s$. The voltage appearing across the capacitor 12 is maintained at this level throughout the charging interval defined by the pulse width of the pulse 104. This process wherein the capacitor 12 is charged to a voltage reflecting the corresponding amplitude of the input signal voltage is subsequently repeated for each of the charging pulses developed at the output 38 of the multivibrator 72. See, for example, the charging intervals beginning at times $t_1$ and $t_2$.

It will be noted that immediately following each of the charging pulses developed at the output 38 of the multivibrator 72 there is developed a pulse of variable width T at the output 50 of the multivibrator 74. These variable width pulses, for example pulses 106 and 116, are coupled to the control input of the analog gate 46 and render the gate conductive for coupling the capacitor 12 to the discharge resistor 22. Thus, referring again to the next to the last waveform of FIG. 4, immediately following each respective charging interval the analog gate 46 is operated for discharging the capacitor through resistor 22 for a period of time T corresponding to the pulse width of the discharge pulses developed at the output 50. The voltage appearing across the capacitor 12 therefore represents a continuous sequence of rapid charging intervals each followed by an associated discharge interval. In FIG. 4, it will be observed that the discharge interval T is maintained at a constant value. Therefore, the voltage developed across the capacitor 12 at the end of each discharge interval will always represent the same percentage of the voltage developed across the capacitor at the beginning of the respective discharge interval. Thus, if the capacitor 12 charged to a value a shortly after time $t_0$, the voltage developed across the capacitor slightly before time $t_1$ could be represented by the expression a/n, where n is determined by the discharge time interval T and the value of the resistor 22. Similarly, if a voltage b is developed across the capacitor 12 shortly after time $t_1$, the value of the voltage across the capacitor just before time $t_2$ would take on a value of b/n. It can thus be seen that the voltage levels appearing across the capacitor 12 at the end of the discharge intervals represent a given percentage of the capacitor voltages at the beginning of each respective discharge interval. It therefore follows that an attenuated representation of the input signal voltage $V_s$ can be obtained by sampling the voltage developed by the capacitor 12 at the end of each of the discharge intervals.

This output sampling process is implemented by the analog gate 56. It will be recalled that the gate 56 is operated in response to the application of pulses to its control input 58 from the output 62 of the multivibrator 70. Referring to FIG. 4, it will be observed that the pulses developed at the output 62 of multivibrator 70 occur immediately after each discharge interval and just prior to the next succeeding charging interval. Therefore, at the end of each discharge interval, and just prior to the next succeeding charging interval, the analog gate 56 is operated for coupling the capacitor 12 to the output storage capacitor 66. Referring to the final waveform of FIG. 4, the voltage impressed upon the capacitor 66 in response to the sample or read out pulse 112 corresponds to the level a/n. In response to the next read out pulse developed on output 62 the voltage developed across the capacitor rises to the level b/n, and so on. The voltage developed across the output capacitor 66, and the corresponding voltage developed on output line 70, thus consists of an attenuated representation of the input signal voltage $V_s$, wherein the attenuation factor is maintained at a constant value of n determined by the discharge interval T which, in turn, is determined by the control voltage coupled to the input 84 of multivibrator 74.

In deriving the waveforms of FIG. 4, the discharge interval T was maintained at a constant value in order to achieve a uniform attenuation factor n. However, by suitably varying the discharge interval T, through operation of the potentiometer 88 or any other device supplying a control voltage to the multivibrator 74, the attenuation factor characterizing the system can likewise be varied. In particular, increasing the length of the discharge interval will increase the resulting attenuation factor while decreasing the discharge interval will correspondingly decrease the attenuation factor. Also, in accordance with sampling theory, it will be appreciated that the pulse repetition rate of the signals developed at the output of the timing circuit should be at least equal to twice the frequency of the input signal voltage as represented by waveform 24.

The circuit of FIG. 3 may also be operated in a synchronous mode wherein the switch 76 is operated to connect the clock 82 to the input of the read out multibrator 70. The circuit operates in a manner substantially identical to the asynchronous mode of operation described above except that the multivibrator 70 is triggered by the pulses of the clock 82 rather than from the output of the multivibrator 74. In order to insure system accuracy, the period of the clock signal produced by the clock 82 should be greater than the sum of the active times of multivibrators 70, 72 and 74. For example, in an audio application, typical active times for multivibrators 70, 72 and 74 may comprise 5 μsec, 5 μsec and 20 μsec respectively. In this case, adequate system performance can be achieved by using a clock signal having a period of 30 μsec with the capacitor 12 and resistor 22 scaled to provide 3 db/μsec of attenuation, giving a maximum attenuation capability of 60 db.

What has thus been shown is an improved voltage controlled attenuator whose operative components are implemented in the form of passive components and switching devices. While a particular embodiment of this attenuator has been shown and described above, it will be obvious to those skilled in the art that various changes and modifications may be made without departing from the invention in its broader aspects. The aim of the appended claims, therefore, is to cover all such changes and modifications as fall within the true spirit and scope of the invention.

What is claimed is:

1. Apparatus for controllably attenuating an input signal voltage comprising:
   capacitive means;
   means for discharging said capacitive means;
   switch means operable for alternately coupling said capacitive means to said input signal voltage and to said discharge means for first and second predetermined time intervals respectively; and
   output means for sampling the voltage developed by said capacitive means following each of said second predetermined time intervals.

2. Apparatus as claimed in claim 1 including control means operable for selectively varying the duration of said second predetermined time interval.

3. Apparatus as claimed in claim 1 wherein said means for discharging comprises a resistor.

4. Apparatus as claimed in claim 2 wherein said switch means comprises:
   timing means for generating first and second repetitive timing signals;
   first gate means responsive to said first timing signal for repetitively coupling said capacitive means to said input signal voltage for said first predetermined time intervals; and
   second gate means responsive to said second timing signal for repetitively coupling said capacitive means to said discharge means for said second predetermined time intervals.

5. Apparatus as claimed in claim 4 wherein said timing means comprises means for generating each of said first and second timing signals in the form of a pulsating signal, said first predetermined time interval being defined by the pulse width of said first timing signal and said second predetermined time interval being defined by the pulse width of said second timing signal.

6. Apparatus as claimed in claim 5 wherein said means for generating each of said first and second timing signals comprises means for generating said first and second pulsating timing signals at the same pulse repetition rate.

7. Apparatus as claimed in claim 6 wherein said timing means comprises means for generating a third pulsating timing signal at said same pulse repetition rate and wherein said output means comprises third gate means responsive to said third timing signal for sampling the voltage developed by said capacitive means for repetitive time intervals defined by the pulse duration of said third timing signal.

8. Apparatus as claimed in claim 7 wherein said timing means comprises a first monostable multivibrator having an output developing said first timing signal, a second monostable multivibrator having an output developing said second timing signal and an input connected to the output of said first multivibrator and a third monostable multivibrator having an output developing said third timing signal and an input connected to the output of said second multivibrator, the output of said third multivibrator being connected to the input of said first multivibrator.

9. Apparatus as claimed in claim 8 wherein said second monostable multivibrator is characterized by an unstable state determined by an applied control voltage and including means for selectively applying a control voltage to said second monostable multivibrator for determining the duration of the unstable state thereof.

10. An attenuator comprising:
    a source of input signal voltage;
    timing means for generating first and second timing signals defining a repetitively occurring sequence of first and second timing intervals;
    capacitive means;
    resistive means for discharging said capacitive means;
    first switch means for coupling said capacitive means to said source of input signal voltage during said first timing intervals;
    second switch means for coupling said capacitive means to said means for discharging during said second timing intervals; and
    output means for repetitively sampling the voltage developed by said capactive means subsequent of each of said second timing intervals.

11. An attenuator according to claim 10 including means for selectively adjusting the duration of said second timing intervals for controlling the amount of attenuation characterizing said attenuator.

12. An attenuator according to claim 11 wherein said timing means comprises means for generating a third timing signal defining a third timing interval in said repetitively occurring sequence, said output means comprising third switch means for sampling the voltage developed by said capacitive means during said third timing intervals.

13. An attenuator according to claim 12 wherein said output means includes means for storing the sampled values of said voltage developed by said capacitive means.

14. Apparatus for attenuating an input signal voltage comprising:
    means for sampling said input signal voltage at a rate at least equal to twice the frequency of said input signal;
    means for causing each of said voltage samples to exponentially decay towards a reference level at a predetermined rate and for a predetermined time interval; and
    means for developing an output signal representing said decayed voltage samples.

15. Apparatus as claimed in claim 14 including means for selectively adjusting the duration of said predetermined time interval for controlling the level of said output signal.

* * * * *